US007507596B2

(12) United States Patent
Yaung et al.

(10) Patent No.: US 7,507,596 B2
(45) Date of Patent: *Mar. 24, 2009

(54) METHOD OF FABRICATING A HIGH QUANTUM EFFICIENCY PHOTODIODE

(75) Inventors: Dun-Nian Yaung, Taipei (TW); Shou-Gwo Wuu, Hsin-chu (TW); Ho-Ching Chen, Hsinchu (TW); Chien-Hsien Tseng, Hsinchu (TW); Jeng-Shyan Lin, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 421 days.

This patent is subject to a terminal disclaimer.

(21) Appl. No.: 11/360,750

(22) Filed: Feb. 23, 2006

(65) Prior Publication Data

US 2006/0148119 A1 Jul. 6, 2006

Related U.S. Application Data

(62) Division of application No. 10/669,516, filed on Sep. 24, 2003, now Pat. No. 7,038,232.

(51) Int. Cl.
*H01L 21/00* (2006.01)
(52) U.S. Cl. ............................ 438/48; 438/228; 438/424
(58) Field of Classification Search ................. 438/123, 438/48, 228, 424
See application file for complete search history.

(56) References Cited

U.S. PATENT DOCUMENTS

| 6,040,592 | A | 3/2000 | McDaniel et al. ........... 257/292 |
| 6,130,422 | A | 10/2000 | Bawolek et al. .......... 250/208.1 |
| 6,258,712 | B1 | 7/2001 | Wang .......................... 438/634 |
| 6,372,603 | B1 | 4/2002 | Yaung et al. ................. 438/424 |
| 6,406,987 | B1 | 6/2002 | Huang ......................... 438/595 |
| 6,946,352 | B2 | 9/2005 | Yaung ......................... 438/296 |
| 2002/0089004 | A1 | 7/2002 | Rhodes ........................ 257/290 |

OTHER PUBLICATIONS

China Office Action mailed Mar. 16, 2007.

*Primary Examiner*—Thanh Nguyen
(74) *Attorney, Agent, or Firm*—Thomas, Kayden, Horstemeyer & Risley

(57) ABSTRACT

The present invention is CMOS image sensor and its method of fabrication. This invention provides an efficient structure to improve the quantum efficiency of a CMOS image sensor with borderless contact. The image sensor comprises a N-well/P-substrate type photodiode with borderless contact and dielectric structure covering the photodiode region. The dielectric structure is located between the photodiode and the interlevel dielectric (ILD) and is used as a buffer layer for the borderless contact. The method of fabricating a high performance photodiode comprises forming a photodiode in the n-well region of a shallow trench, and embedding a dielectric material between the ILD oxide and the photodiode having a refraction index higher than the ILD oxide.

22 Claims, 5 Drawing Sheets

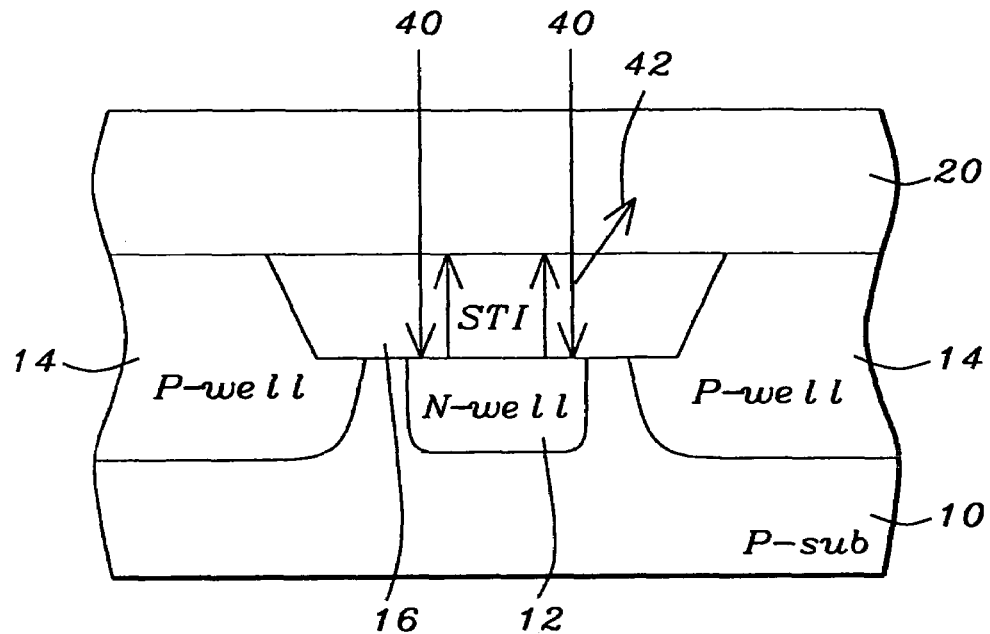
FIG. 1 - Prior Art
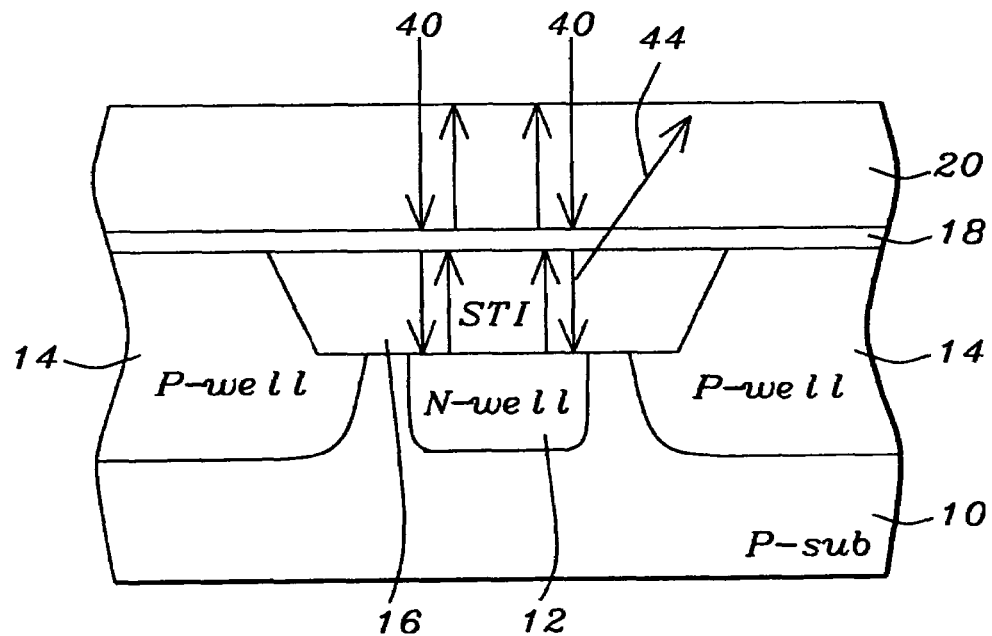
FIG. 2 - Prior Art

METHOD OF FABRICATING A HIGH QUANTUM EFFICIENCY PHOTODIODE

CROSS-REFERENCE TO RELATED APPLICATIONS

This application is a division of U.S. patent application Ser. No. 10/669,516, filed Sep. 24, 2003 now U.S. Pat. No. 7,038,232.

BACKGROUND OF THE INVENTION

1. Field of Invention

This invention relates to fabrication of an image sensor, and more particularly, to the fabrication of an embedded CMOS photodiode in the fabrication of an image sensor.

2. Description of Related Art

An image sensor comprises a photodiode, a dielectric structure on top of the photodiode, and an interlevel dielectric (ILD) layer overlying the dielectric layer. The photodiode utilizes a diode depletion region formed across a p-n junction. The photodiode receives light and outputs an electrical charge corresponding to the amount of light received. The electric charge is converted into current or voltage levels defining an image which is stored in digital memory. Recently, photodiodes formed as an n-well in a p-substrate, for example, have been built underlying shallow trench isolation (STI) on silicon semiconductor chips, due to low dark current and high quantum efficiency (QE), or the amount of current or charge produced per incident photon. All of the light that passes through the internal structure of the detector should be absorbed, but losses can occur due to light reflection or destructive interference.

FIG. 1 illustrates an image sensor of the prior art, such as described in U.S. Pat. No. 6,040,592 to McDaniel, et al. and U.S. Pat. No. 6,372,603 to Yaung et al. The image sensor comprises a well-to-substrate photodiode comprising p-substrate 10 and N-well 12. Oxide region 16 may be a shallow trench isolation (STI) region as shown or a local oxidation of silicon field oxide region as the dielectric structure covering the photodiode. Overlying the dielectric structure is an interlevel dielectric layer 20. CMOS device structures, including metal interconnect 30 and other devices, not shown, are formed in and on other portions of the substrate. Light 40 is shown entering the transparent dielectric layers and penetrating to the photodiode at 12. Some of this light is reflected 42 especially at an interface of two materials having a large difference in refraction indices, such as silicon dioxide (16)/silicon (12) where the refraction indices are 1.4 and 3.3, respectively.

The borderless contact process is used in the CMOS process to tighten the design rules and to increase circuit density by using a silicon nitride or silicon oxynitride stop layer. Borderless contacts or "unframed" contacts solve many of the micron and sub-micron MOSFET contact problems; making better use of the space and area over the source/drain region. If the borderless process is adopted for the image sensor, a dielectric structure having high refraction index/low refraction index/high refraction index will exist. FIG. 2 illustrates such a structure. Here, for example, a silicon oxynitride layer 18 has been formed overlying the STI region 16. Both SiON and silicon have a high refraction index and silicon dioxide has a low refraction index. The refraction index of SiON is about 1.8-2.5, higher than the 1.4 refraction index of silicon dioxide. Here, destructive interference 44 is seen when light penetrates to the photodiode. This destructive interference is caused by the presence of the silicon oxynitride layer.

U.S. Pat. No. 6,130,422 to Bawolek et al. shows a structure similar to that in FIG. 2 except that they add a buffer oxide layer underlying their silicon nitride layer. The buffer oxide layer is to relieve stress. The destructive interference will still be found in this structure. Borderless contacts are part of the advanced designs and processing associated with shallow trench isolation (STI). U.S. Pat. No. 6,406,987 to Huang and U.S. Pat. No. 6,258,712 to Wang both describe a borderless contact process with an etch stop.

What is required is a method to overcome losses and enhance the quantum efficiency of image sensors, with or without borderless contact processes.

SUMMARY OF THE INVENTION

Accordingly, it is a primary object of the present invention to provide a high quantum efficiency image sensor.

It is another object of the invention to provide a high quantum efficiency CMOS image sensor.

Another object of the invention is to provide a method for fabricating a high quantum efficiency CMOS image sensor.

Yet another object is to provide a high quantum efficiency CMOS image sensor comprising a photodiode and an overlying interlevel dielectric layer having a dielectric layer therebetween wherein the dielectric layer improves the photoresponse of the photodiode.

Yet another object is to provide a method for fabricating a high quantum efficiency CMOS image sensor comprising a photodiode and an overlying interlevel dielectric layer having a dielectric layer therebetween wherein the dielectric layer improves the photo-response of the photodiode.

A further object is to provide a high quantum efficiency CMOS image sensor comprising a photodiode and an overlying interlevel dielectric layer having a dielectric layer therebetween wherein the dielectric layer prevents destructive interference and suppresses reflection thereby improving the photo-response of the photodiode.

In accordance with the objects of the invention, a method of fabricating a high quantum efficiency CMOS image sensor is achieved.

Also in accordance with the objects of the invention, a high quantum efficiency CMOS image sensor is achieved.

The image sensor is composed of a photodiode, and an embedded dielectric layer between the photodiode and the ILD, the embedded dielectric layer having a refractive index higher than the ILD oxide.

BRIEF DESCRIPTION OF THE DRAWINGS

FIGS. 1 and 2 are cross-sectional representations of image sensors of the prior art.

DETAILED DESCRIPTION OF THE INVENTION

The present invention provides a method of fabricating a high performance CMOS photodiode, made with or without borderless contact processes, having enhanced quantum efficiency, and a corresponding structure of an image sensor having a photodiode having enhanced quantum efficiency.

The enhanced quantum efficiency of the photodiode of the present invention is achieved by the introduction of a layer between the ILD and the silicon photodiode having a refraction index in between the high rate of the silicon and the low rate of the ILD layer.

Figure 3:
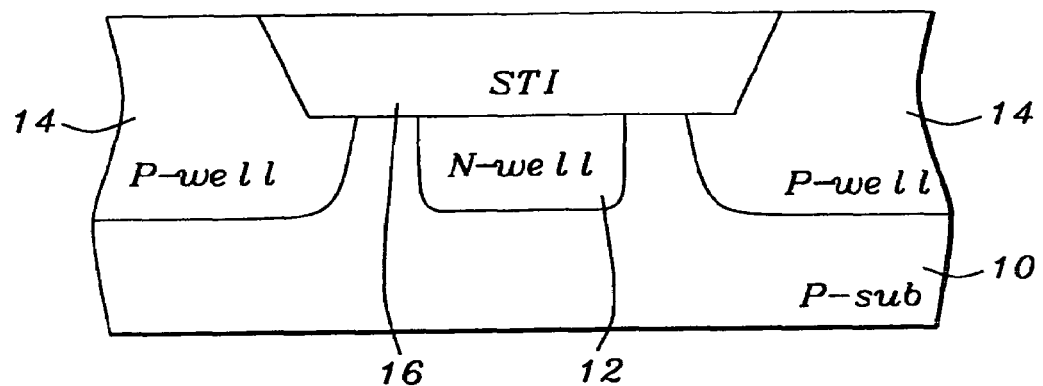
FIGS. 3 through 6 are cross-sectional representations of a preferred embodiment of the present invention.

The process of the present invention will be described with reference to FIGS. 3-6. An N-type photosensor is illustrated in the drawings, but it will be understood by those skilled in the art that a P-type photosensor may be formed by reversing the conductivity of the substrate and well regions. Referring now more particularly to FIG. 3, there is shown p-doped silicon substrate 10. P-wells 14 have been formed in the substrate. A Shallow Trench Isolation (STI) region 16 has been formed as is known in the art, by forming an opening in substrate 10 and filling the opening with an oxide. Typically, Chemical Mechanical Polishing (CMP) is used after filling the trench to form a planar top surface. N-well 12 is formed underlying the STI region 16. For example, the N-well could be formed as described in U.S. Pat. No. 6,372,603 to Yaung et al where the outer portions of the STI trench are masked prior to trench filling. The N-well region is formed by ion implantation under the trench not covered by the mask. The N-well in the p-substrate 12 forms the photodiode. Gate electrodes and source and drain regions are formed as is conventional in the art in other areas of the substrate, not shown in the figures.

Figure 4:
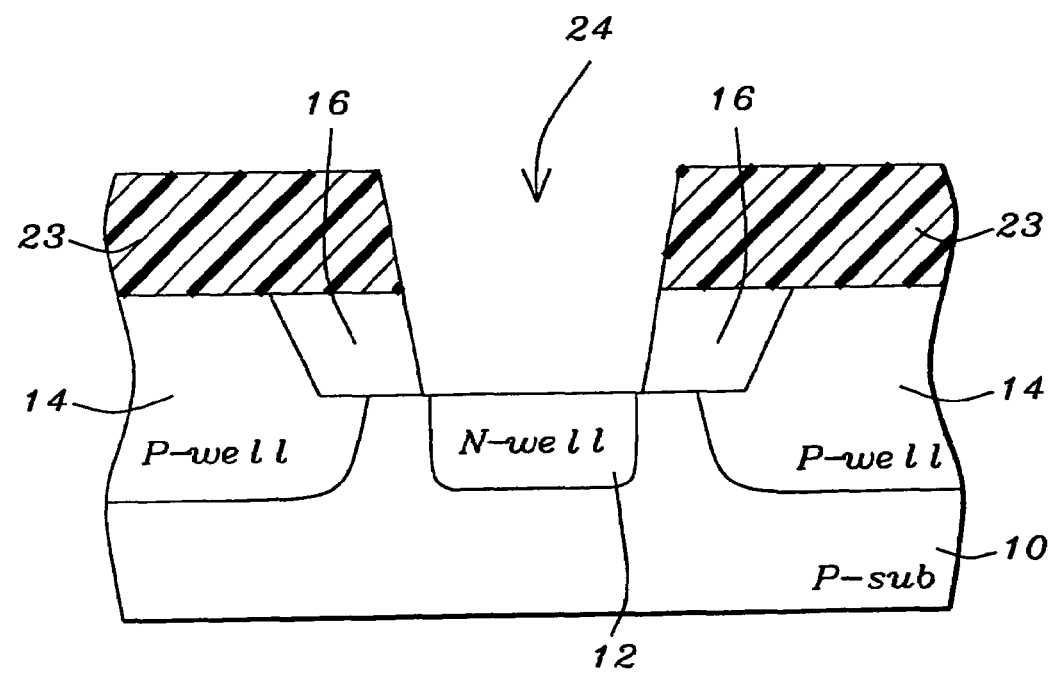

Now, the key feature of the present invention will be described. As shown in FIG. 4, prior to the borderless contact buffer layer deposition, a photoresist mask 23, for example, is developed as is known in the art to define an opening 24 in the STI region overlying the photodiode 12. The oxide filling the trench is etched away where it is not covered by the mask 23. The mask is removed.

Figure 5:
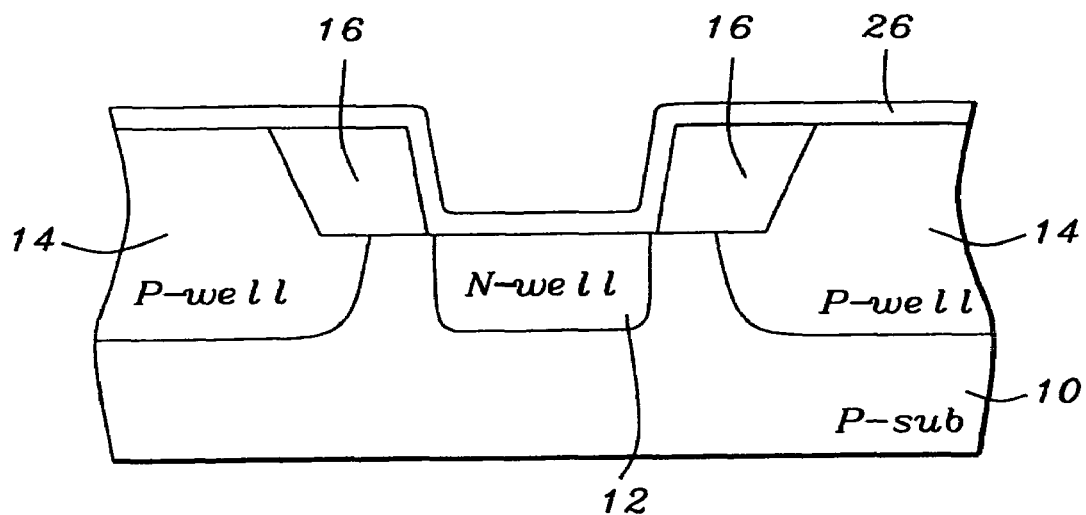

Referring now to FIG. 5, a stop layer 26 comprising silicon nitride or silicon oxynitride is deposited overlying the substrate and within the etched out STI area contacting the photodiode 12. This stop layer can be the stop layer used in a borderless contact process. If a borderless contact process is not used, the stop layer can be deposited as an extra step. The stop layer 26 has a preferred thickness of between about 400 and 1000 Angstroms. While stop layers of silicon nitride or silicon oxynitride are preferred, any material having a refractive index of between silicon (3.3) and silicon dioxide (1.4) can be used in the process of the invention.

Figure 6:
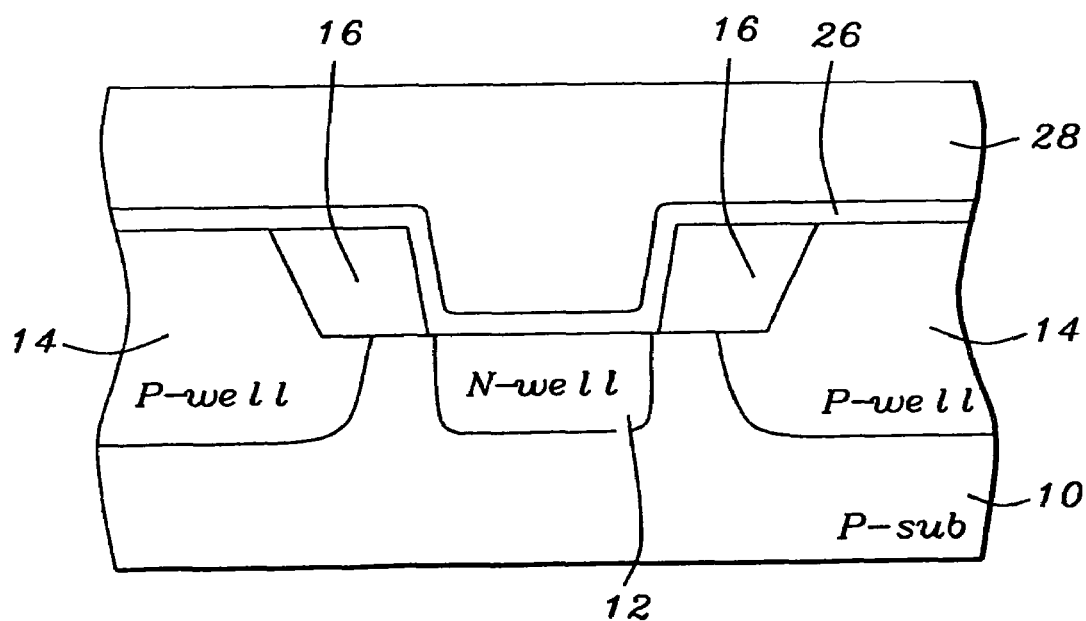

Now, the interlevel dielectric layer 28 is deposited, as shown in FIG. 6, to a thickness of between about 7000 and 13,000 Angstroms, followed by a planarization step such as CMP. The presence of the stop layer 26 directly overlying the photodiode 12 solves the destructive interference problem and suppresses reflection since the refraction index differences at the interfaces of the layers are small. That is, the refraction index of silicon (12) is 3.3, the refraction index of SiON or SiN (26) is 1.8-2.5, and the refraction index of silicon dioxide (28) is 1.4. The stop layer 26 between the silicon and the silicon dioxide reduces the diffraction difference at the interfaces, thus suppresses reflection and destructive interference.

Figure 7:
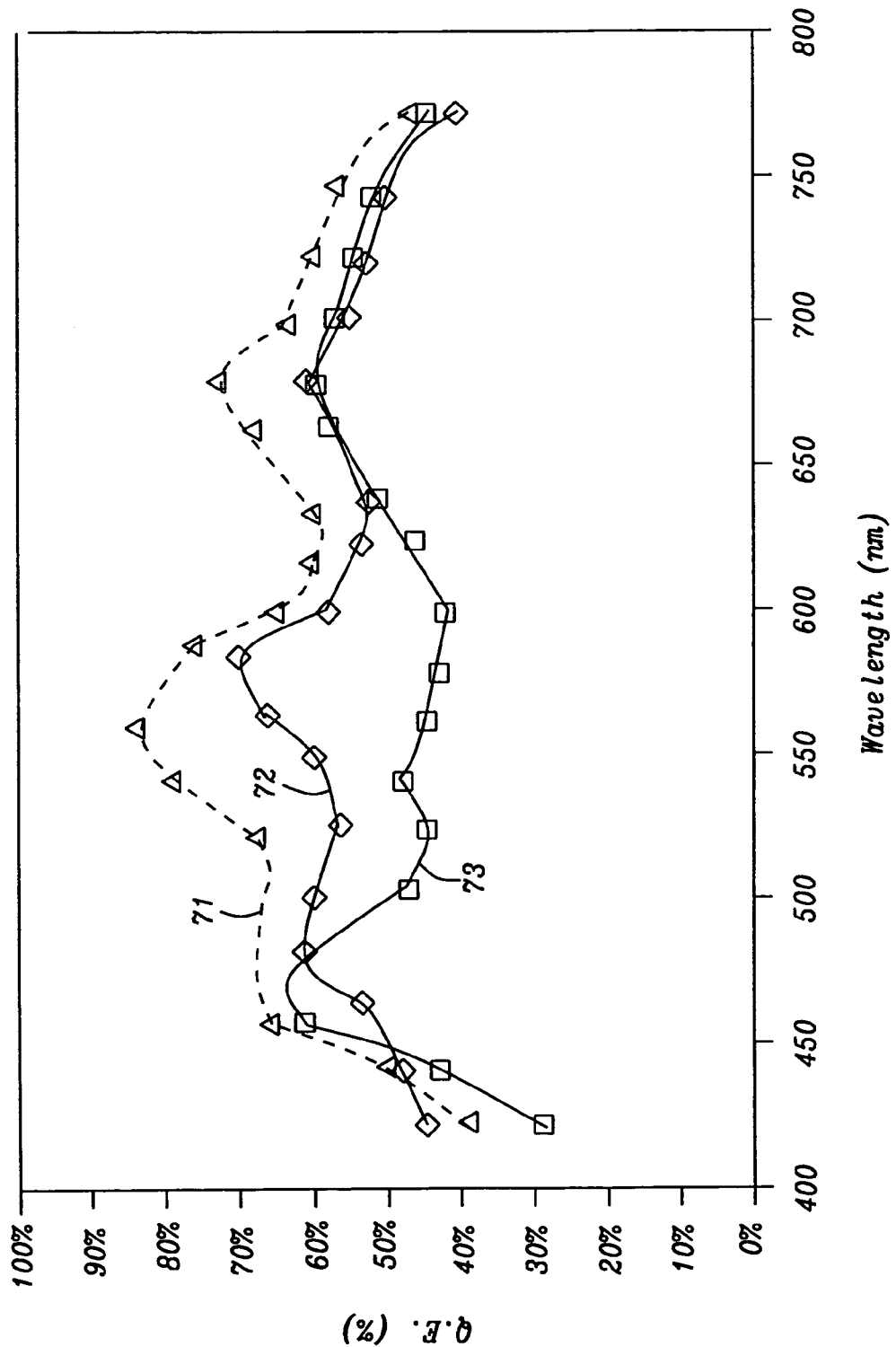
FIG. 7 is a graphical representation of the quantum efficiency of the photodiodes of the invention and of the prior art.

FIG. 7 graphically illustrates the quantum efficiency of the structure of the present invention in line 71. Line 72 shows the QE of the prior art without a stop layer such as shown in FIG. 1. Line 73 shows the QE of the prior art with a stop layer such as shown in FIG. 2. The quantum efficiency (QE) of the structures is also shown in Table 1.

TABLE 1

| Structure of drawing figure | Layered Structure of Films on Photodiode | Quantum Efficiency at 550 nm |
| --- | --- | --- |
| 2 | SiO/SiON/SiO/Si | 42% |
| 1 | SiO/Si | 62% |
| 6 (invention) | SiO/SiON/Si | 82% |

The highest overall QE over all the visible spectrum is achieved with SiO/SiON/Si or SiO/SiN/Si structured layers and is a large improvement over the prior art.

The enhanced QE image sensor of the present invention is shown in cross-section in FIG. 6. The image sensor comprises a photodiode formed by an N-well 12 in a p-substrate 10. (It will be understood that a P-photodiode could be formed by a P-well in an N-substrate). The photodiode underlies a STI region 16. The central portion of the STI region has been removed so that a stop layer 26 directly overlies the photodiode. The stop layer preferably comprises silicon nitride or silicon oxynitride. An interlevel dielectric layer 28 overlies the stop layer and the substrate, thereby completing the image sensor.

Figure 8:
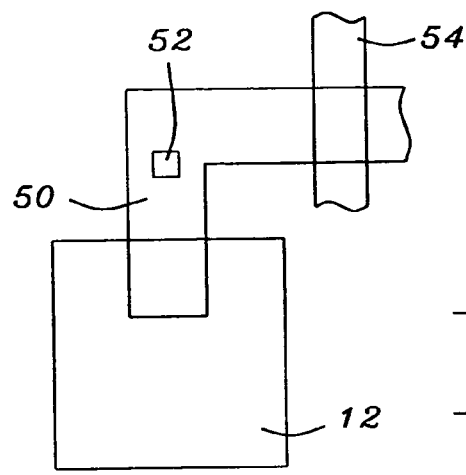
FIG. 8 is a top view of the image sensor of the present invention.

FIG. 8 is a top view of the image sensor of the present invention. Photodiode 12 is shown. 50 represents an active region. Polysilicon gate 54 and contact 52 are also shown.

Figure 9:
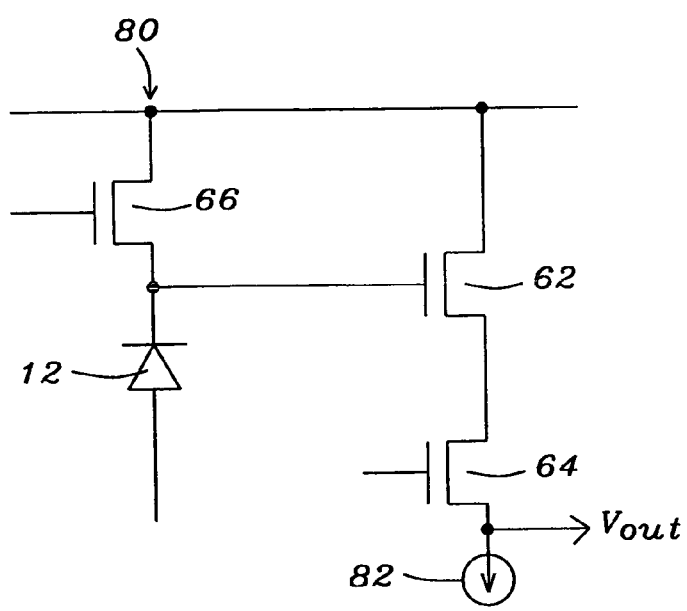
FIG. 9 is a circuit diagram of one possible image sensor design using the improved photodiode of the present invention.
Figure 10:
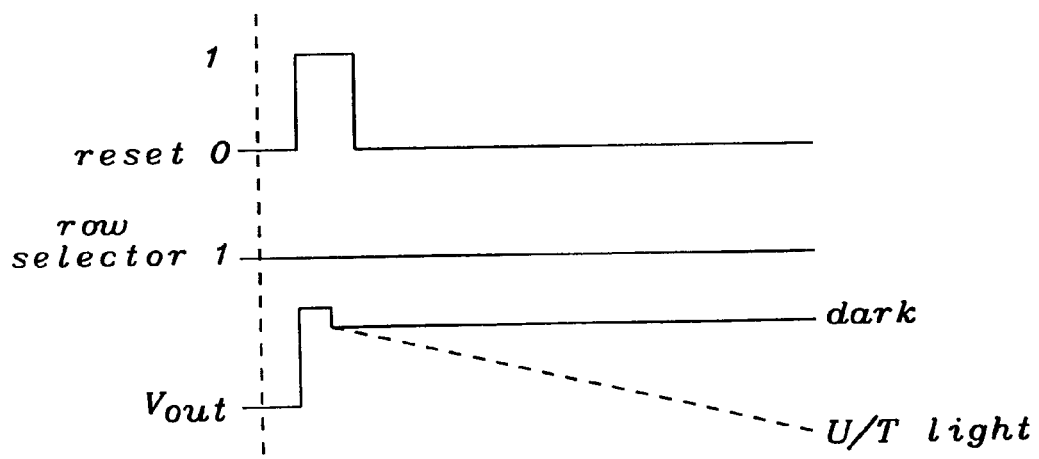
FIG. 10 is a timing diagram for the circuit shown in FIG. 9.

FIG. 9 is a circuit diagram of one possible image sensor design using the improved photodiode of the present invention. Three NMOS transistors 62, 64, and 66 and photodiode 12 are shown. Reset transistor 80 and Vout 82 are shown. FIG. 10 shows a timing diagram for the circuit shown in FIG. 9. The slope of the dotted line for Vout increases with increasing light intensity.

The present invention provides a stop layer directly overlying the silicon surface of an n-well/p-substrate photodiode. The refraction index of the stop layer is lower than that of silicon and higher than that of an overlying interlevel dielectric layer. The graduated refraction indices of the three layers improves quantum efficiency of the photodiode. The improved image sensor of the present invention can be fabricated according to a CMOS borderless contact process.

While the invention has been particularly shown and described with respect to the preferred embodiments, thereof, it will be understood by those skilled in the art that various changes in form and details may be made without departing from the spirit and scope of the invention

What is claimed is:

1. A method of fabricating a high quantum efficiency photodiode comprising:

forming a well region of a first conductivity in a substrate of a second conductivity opposite to said first conductivity wherein said well region in said substrate forms said photo diode;

forming an isolation region within said substrate overlying said well region;

removing a portion of said isolation region overlying said well region;

thereafter depositing a stop layer on said well region; and depositing an interlevel dielectric layer overlying said stop layer to complete fabrication of said high performance photodiode.

2. The method according to claim 1 wherein said well region is an N-well and said substrate is a P-substrate.

3. The method according to claim 1 wherein said well region is a P-well and said substrate is an N-substrate.

4. The method according to claim 1 wherein said isolation region is a shallow trench isolation.

5. The method according to claim 1 wherein said stop layer comprises silicon nitride or silicon oxynitride.

6. The method according to claim 1 wherein said stop layer has a thickness of between about 400 and 1000 Angstroms.

7. The method according to claim 1 wherein said interlevel dielectric layer comprises silicon oxide.

8. The method according to claim 1 where said interlevel dielectric layer has a thickness of between about 7000 and 13,000 Angstroms.

9. The method according to claim 1 wherein a refraction index of said stop layer is less than a refraction index of said well region and greater than a refraction index of said interlevel dielectric layer.

10. The method according to claim 1 wherein said step of depositing a stop layer comprises forming a stop layer for a CMOS borderless contact process.

11. A method of fabricating a high quantum efficiency photodiode comprising:
   forming a well region of a first conductivity in a substrate of a second conductivity opposite to said first conductivity wherein said well region in said substrate forms said photodiode;
   forming an isolation region within said substrate overlying said well region;
   fabricating semiconductor device structures in a CMOS process;
   removing a portion of said isolation region overlying said photodiode;
   thereafter depositing a stop layer directly on said well region; and
   depositing an interlevel dielectric layer overlying said stop layer to complete fabrication of said high performance photodiode.

12. The method according to claim 11 wherein said well region is an N-well and said substrate is a P-substrate.

13. The method according to claim 11 wherein said well region is a P-well and said substrate is an N-substrate.

14. The method according to claim 11 wherein said isolation region is a shallow trench isolation.

15. The method according to claim 11 wherein said semiconductor device structures comprise gate electrodes and source and drain regions formed in and on said substrate in areas away from said photodiode.

16. The method according to claim 11 wherein said stop layer comprises silicon nitride or silicon oxynitride.

17. The method according to claim 11 wherein said stop layer has a thickness of between about 400 and 1000 Angstroms.

18. The method according to claim 11 wherein said interlevel dielectric layer comprises silicon oxide.

19. The method according to claim 11 where said interlevel dielectric layer has a thickness of between about 7000 and 13,000 Angstroms.

20. The method according to claim 11 wherein a refraction index of said stop layer is less than a refraction index of said well region and greater than a refraction index of said interlevel dielectric layer.

21. The method according to claim 11 wherein said step of depositing a stop layer comprises forming a stop layer for a CMOS borderless contact process.

22. A method of fabricating a high quantum efficiency photodiode comprising:
   forming a well region of a first conductivity in a substrate of a second conductivity opposite to said first conductivity wherein said well region in said substrate forms said photo diode;
   forming an isolation region within said substrate overlying said well region;
   removing a portion of said isolation region overlying said well region;
   thereafter depositing a stop layer on said well region; and
   depositing an interlevel dielectric layer overlying said stop layer to complete fabrication of said high performance photodiode, wherein refraction index is reduced from said interlevel dielectric layer to said photo diode.

* * * * *